US011515183B2

United States Patent
Motegi et al.

(10) Patent No.: US 11,515,183 B2
(45) Date of Patent: Nov. 29, 2022

(54) SUBSTRATE PROCESSING SYSTEM

(71) Applicant: TOKYO ELECTRON LIMITED, Tokyo (JP)

(72) Inventors: Suguru Motegi, Miyagi (JP); Takashi Kumagai, Miyagi (JP); Akira Kodashima, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 101 days.

(21) Appl. No.: 16/984,520

(22) Filed: Aug. 4, 2020

(65) Prior Publication Data
US 2021/0043480 A1 Feb. 11, 2021

(30) Foreign Application Priority Data

Aug. 7, 2019 (JP) .............................. JP2019-145718

(51) Int. Cl.
*H01L 21/67* (2006.01)
*H01L 21/677* (2006.01)

(52) U.S. Cl.
CPC .. *H01L 21/67196* (2013.01); *H01L 21/67103* (2013.01); *H01L 21/67109* (2013.01); *H01L 21/67201* (2013.01); *H01L 21/67751* (2013.01)

(58) Field of Classification Search
CPC ......... H01L 21/67196; H01L 21/67103; H01L 21/67751; H01L 21/67201; H01L 21/67161; H01L 21/67178
See application file for complete search history.

(56) References Cited

U.S. PATENT DOCUMENTS

| | | | | |
|---|---|---|---|---|
| 6,059,507 | A * | 5/2000 | Adams | H01L 21/67778 414/217 |
| 6,338,626 | B1 * | 1/2002 | Saeki | H01L 21/67751 414/217 |
| 8,403,613 | B2 * | 3/2013 | van der Meulen | H01L 21/67745 414/217 |
| 9,530,666 | B2 | 12/2016 | Mizuno et al. | |
| 2006/0182615 | A1 * | 8/2006 | Kurita | H01L 21/67748 414/806 |
| 2008/0014055 | A1 * | 1/2008 | van der Meulen | H01L 21/67748 414/187 |

(Continued)

FOREIGN PATENT DOCUMENTS

JP 2012-501549 A 1/2012
JP 2014-511575 A 5/2014
(Continued)

*Primary Examiner* — Kaitlin S Joerger
(74) *Attorney, Agent, or Firm* — Weihrouch IP (57) ABSTRACT

A substrate processing system includes a first chamber, a second chamber, and a cooling passage. The first chamber has therein a space for processing a substrate transferred from a first transfer chamber maintained in a vacuum atmosphere. The second chamber is disposed below the first chamber to be vertically aligned with the first chamber and configured to communicate with the first transfer chamber and a second transfer chamber maintained in an atmospheric atmosphere. The second chamber has substantially the same footprint as a footprint of the first chamber. Further, a cooling passage is disposed between the first chamber and the second chamber and configured to allow a coolant to flow therethrough.

12 Claims, 3 Drawing Sheets

(56) References Cited

U.S. PATENT DOCUMENTS

| | | | |
|---|---|---|---|
| 2013/0302115 A1* | 11/2013 | Wakabayashi | H01L 21/67196 414/217 |
| 2013/0327363 A1* | 12/2013 | Inadomi | H01L 21/67751 134/61 |
| 2013/0333616 A1* | 12/2013 | Klindworth | H01L 21/6719 118/729 |
| 2019/0355600 A1* | 11/2019 | Rice | B25J 15/0616 |
| 2021/0005505 A1* | 1/2021 | Wagatsuma | H01L 21/67098 |
| 2021/0043480 A1* | 2/2021 | Motegi | H01L 21/67751 |

FOREIGN PATENT DOCUMENTS

| | | |
|---|---|---|
| JP | 6141855 B2 | 6/2017 |
| WO | 2010/025253 A2 | 3/2010 |
| WO | 2012/118897 A2 | 9/2012 |

\* cited by examiner

SUBSTRATE PROCESSING SYSTEM

CROSS-REFERENCE TO RELATED APPLICATIONS

This application claims priority to Japanese Patent Application No. 2019-145718, filed on Aug. 7, 2019, the entire contents of which are incorporated herein by reference.

TECHNICAL FIELD

The present disclosure relates to a substrate processing system.

BACKGROUND

A load-lock chamber, having one or more separate, environmentally isolated environments, is suggested (Japanese Patent Application Publication No. 2012-501549). The load-lock chamber disclosed in Japanese Patent Application Publication No. 2012-501549 includes a chamber body having a plurality of chambers that are vertically stacked and environmentally isolated, and the chambers are separated by a vacuum-tight horizontal inner wall. In addition, a dual load-lock chamber capable of processing a substrate is suggested (Japanese Patent Application Publication No. 2014-511575). The dual load-lock chamber disclosed in Japanese Patent Application Publication No. 2014-511575 includes a chamber body that defines a first chamber volume and a second chamber volume that are isolated from each other.

The present disclosure provides a technique capable of suppressing an increase in a footprint of a substrate processing system.

SUMMARY

In accordance with an aspect of the present disclosure, there is provided a substrate processing system including: a first chamber having therein a space for processing a substrate transferred from a first transfer chamber maintained in a vacuum atmosphere; a second chamber disposed below the first chamber to be vertically aligned with the first chamber and configured to communicate with the first transfer chamber and a second transfer chamber maintained in an atmospheric atmosphere, the second chamber having substantially the same footprint as a footprint of the first chamber; and a cooling passage disposed between the first chamber and the second chamber and configured to allow a coolant to flow therethrough.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments of the present disclosure will be described in detail with reference to the accompanying drawings. The following embodiments are not restrictive and can be appropriately combined without contradicting process contents thereof. Further, like reference numerals will be given to like parts having substantially the same functions and configurations throughout the specification and the drawings and redundant description thereof will be omitted.

In the drawings to be referred to, for the sake of convenience of explanation, an orthogonal coordinate system in which the X-axis direction, the Y-axis direction, and the Z-axis direction orthogonal to each other are defined, and the Z-axis is set to a vertical direction, may be illustrated. The X-axis direction and the Y-axis direction are horizontal directions. In the following description, the positive direction of the Z-axis may be set to an upward direction and the negative direction of the Z-axis may be set to a downward direction.

In the dual load-lock module including the first chamber volume and the second chamber volume disclosed in Japanese Patent Application Publication No. 2014-511575, a substrate is heated in the second chamber volume. Therefore, an assembly that supports the heated substrate is disposed while being substantially insulated from the chamber body. Further, a mechanism for cooling the assembly that supports the substrate is provided. However, it is difficult to perform sufficient temperature control depending on a process performed in the second chamber volume. In the load-lock module, it is preferable to cool the processed substrate and unload the cooled substrate to the atmospheric atmosphere.

Therefore, in a substrate processing system according to an embodiment of the present disclosure to be described below, a load-lock module includes at least two separate chambers having substantially the same footprint. Further, a cooling passage is disposed between the at least two chambers. Accordingly, the substrate processing system according to the embodiment can perform a process of the substrate in the load-lock module and a transfer of the processed substrate without increasing the footprint of the substrate processing system.

In the following description, "atmospheric atmosphere" indicates a normal atmosphere, i.e., an air environment, and "vacuum atmosphere" indicates an environment whose pressure is lower than the atmospheric pressure.

Example of a Substrate Processing System According to Embodiment

Figure 1:
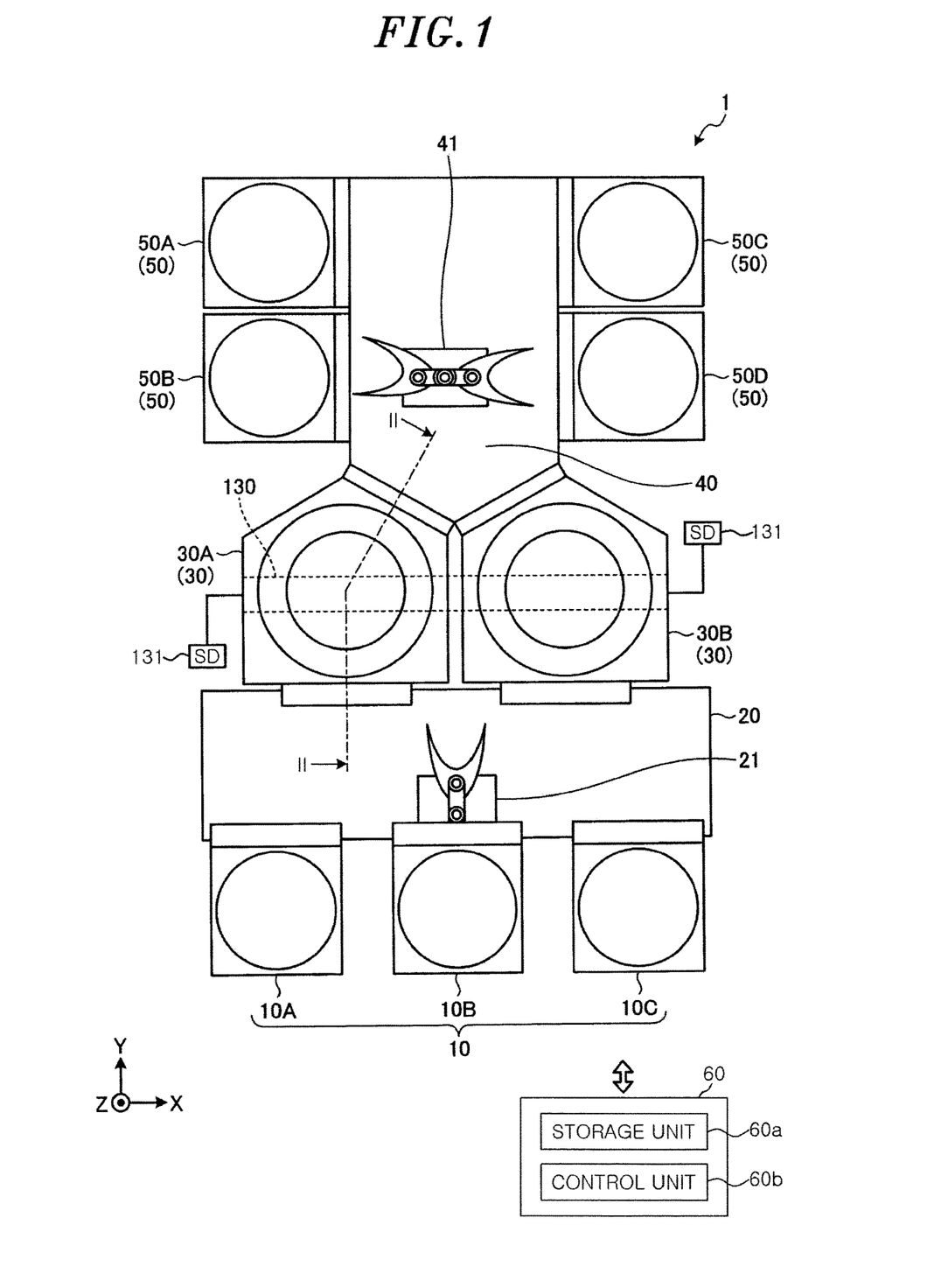
FIG. 1 shows an example of a configuration of a substrate processing system according to an embodiment.

FIG. 1 shows an example of a configuration of a substrate processing system according to an embodiment. A substrate processing system 1 includes a load port 10, an atmospheric transfer chamber 20, a load-lock module 30, a vacuum transfer chamber 40, a processing module 50, and a controller 60.

The load port 10 is a mounting unit on which a carrier, e.g., a front opening unified pod (FOUP) containing substrates, is installed. When the FOUP is installed and fixed onto the load port 10, a lid of the FOUP is moved together with a gate of the load port 10, so that a substrate in the FOUP can be transferred to the atmospheric transfer chamber 20. A substrate processed in the substrate processing system 1 is transferred from the FOUP fixed onto the load port 10 into the processing module 50 through the atmospheric transfer chamber 20, the load-lock module 30, and the vacuum transfer chamber 40. When the processing in the processing module 50 is completed, the substrate is returned to the FOUP. In the example of FIG. 1, load ports 10A, 10B and 10C are illustrated. The load ports 10A to 10C are collectively referred to as "load port 10" unless otherwise stated. The number of the load ports 10 of the substrate processing system 1 is not limited to that shown in FIG. 1, and four or more load ports may be arranged.

The atmospheric transfer chamber 20 is maintained in an atmospheric atmosphere. The atmospheric transfer chamber 20 has therein a space for transferring the substrate. The atmospheric transfer chamber 20 shown in FIG. 1 has a substantially rectangular shape in a plan view. A plurality of load ports 10 is arranged along one long side of the substantially rectangular shape. The load-lock module 30 is arranged on the other long side opposite to the long side where the load ports 10 are arranged.

A first transfer mechanism 21 for transferring the substrate is disposed in the atmospheric transfer chamber 20. The first transfer mechanism 21 is, e.g., a transfer robot having an arm capable of moving in three axial directions (X-axis direction, Y-axis direction, and Z-axis direction). The first transfer mechanism 21 extracts a substrate from the FOUP and places the substrate on a substrate support (substrate support 121; see FIG. 2) in the load-lock module 30.

Figure 2:
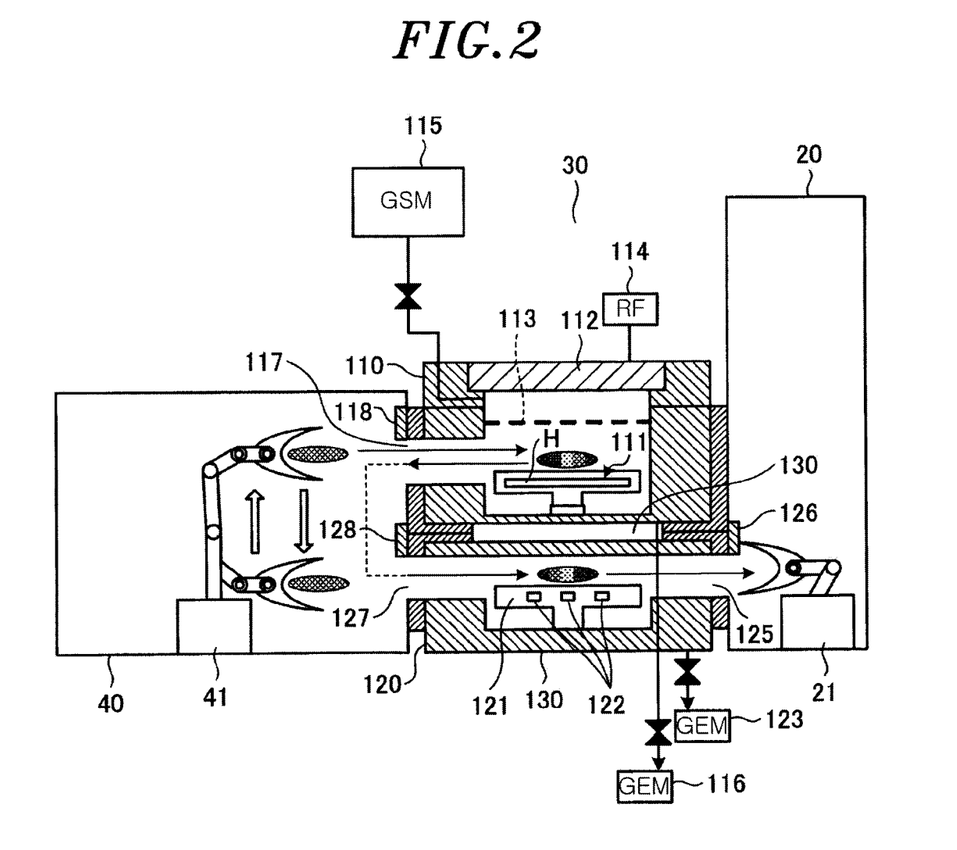
FIG. 2 is a schematic cross-sectional view showing a configuration of a load-lock module of the substrate processing system according to the embodiment.

The load-lock module 30 has therein a space for transferring a substrate between the atmospheric transfer chamber 20 and the vacuum transfer chamber 40. The load-lock module 30 also has therein a space for processing the substrate. FIG. 2 is a schematic cross-sectional view showing a configuration of the load-lock module 30 of the substrate processing system 1 according to the embodiment. FIG. 2 shows a schematic cross section of the load-lock module 30 taken along a line II-II in FIG. 1. Further, FIG. 1 shows two load-lock modules 30A and 30B. The load-lock modules 30A and 30B are collectively referred to as "the load-lock module 30" unless otherwise stated. The number of the load-lock modules 30 of the substrate processing system 1 is not limited to that shown in FIG. 1, and three or more load-lock modules 30 may be arranged.

The load-lock module 30 shown in FIG. 2 includes a first chamber 110, a second chamber 120, and a cooling passage 130. The first chamber 110 is similar to a chamber of the processing module 50 to be described later and has therein a space for processing the substrate. A substrate support 111 on which a target substrate is placed is disposed at the center of the first chamber 110. A heater H as a heating mechanism for heating the substrate support 111 is disposed in the substrate support 111. An upper electrode 112 is disposed above the substrate support 111 with a partition wall 113 interposed therebetween. The upper electrode 112 is, e.g., a coil that generates an inductive electromagnetic field with voltage application. The upper electrode 112 is disposed at a ceiling portion of the first chamber 110. The upper electrode 112 is connected to a radio frequency power supply (RF) 114. The radio frequency power supply 114 is configured to supply a radio frequency power to the upper electrode 112. A plurality of through-holes is formed in the partition wall 113. Radicals in plasma generated on the upper electrode 112 side above the partition wall 113 move to the substrate support 111 side below the partition wall 113 through the through-holes. In other words, the partition wall 113 shields ultraviolet light and ions in the generated plasma and passes only the radicals to reach the side where the target substrate is disposed. The first chamber 110 is connected to a gas supply mechanism (GSM) 115 for supplying a processing gas into the first chamber 110, a gas exhaust mechanism (GEM) 116 for exhausting the first chamber 110, and the like. The first chamber 110 may be provided with a cooling mechanism for cooling a member of the first chamber 110 heated by substrate processing.

In the first chamber 110, the substrate is processed under the control of the controller 60. The substrate processing is, e.g., etching, ashing, film formation or the like. The substrate processing performed in the first chamber 110 is not particularly limited. Since, however, the first chamber 110 is disposed near the atmospheric transfer chamber 20 in the present embodiment, it is convenient to perform, in the first chamber 110 after etching or film formation is performed in the processing module 50, foreign substance removal or the like that is generally performed before the substrate is unloaded to enter the atmospheric transfer chamber 20.

An inner space of the first chamber 110 communicates with an inner space of the vacuum transfer chamber 40 through a gate 117. The gate 117 is opened and airtightly closed by a gate valve 118. Further, the inner space of the first chamber 110 does not communicate with an inner space of the atmospheric transfer chamber 20. The gate 117 has a size that allows a leading end of a second transfer mechanism 41 (to be described later) holding the substrate to pass therethrough.

The substrate support 111 is provided with a plurality of lift pins that can be protruded (raised) to a position beyond the surface of the substrate support 111 and retracted (lowered) to a position below the substrate support 111 where the lift pins can be accommodated. The lift pins receive the substrate transferred from the vacuum transfer chamber 40 at the raised position. The lift pins that have received the substrate are lowered, so that the substrate is placed on the substrate support 111. In the case of unloading the substrate from the first chamber 110, the lift pins are raised to separate the substrate from the surface of the substrate support 111. A leading end of the arm of the second transfer mechanism (to be described later) reaches a gap between an upper surface of the substrate support 111 and a bottom surface of the substrate and, then, the lift pins are lowered. Accordingly, the substrate is held on the arm and transferred to the vacuum transfer chamber 40. Although the transfer of the substrate by using the lift pins has been described, this is merely an example and the substrate may be transferred between the first chamber 110 and the vacuum transfer chamber 40 by another mechanism.

The second chamber 120 is disposed under the first chamber 110. Similar to the first chamber 110, the second chamber 120 has therein a substrate support 121 for placing thereon a substrate. The substrate support 121 has a cooling mechanism 122 for cooling a substrate placed thereon. The cooling mechanism 122 is configured to cool the substrate support 121 to a room temperature, e.g., 25° C. to 30° C. The cooled substrate is transferred to the atmospheric transfer chamber 20. Similar to the substrate support 111 of the first chamber 110, the substrate support 121 may be provided with a heating mechanism or the like. Further, the second chamber 120 is provided with a gas exhaust mechanism (GEM) 123 for controlling an inner atmosphere thereof.

The substrate support 121 has a plurality of lift pins that can be protruded (raised) to a position beyond the surface of the substrate support 121 and retracted (lowered) to a position below the substrate support 121 where the lift pins can be accommodated. The lift pins receive the substrate transferred from each of the atmospheric transfer chamber 20 and the vacuum transfer chamber 40 at the raised position. The lift pins that have received the substrate are lowered so that the substrate is placed on the substrate support 121. In the case of unloading the substrate from the second chamber 120, the lift pins are raised to separate the substrate from the surface of the substrate support 121. A leading end of the arm of the first transfer mechanism or the second transfer mechanism (to be described later) reaches a gap between an upper surface of the substrate support 121 and a bottom surface of the substrate and, then, the lift pins are lowered. Accordingly, the substrate is held on the arm and transferred. Similar to the first chamber 110, although the transfer of the substrate by using the lift pins has been described, this is merely an example and the substrate may be transferred between the second chamber 110 and each of the atmospheric transfer chamber 20 and the vacuum transfer chamber 40 by another mechanism.

An inner space of the second chamber 120 communicates with the inner space of the atmospheric transfer chamber 20 through a gate 125. The gate 125 is opened and airtightly closed by a gate valve 126. The inner space of the second chamber 120 also communicates with the inner space of the vacuum transfer chamber 40 through a gate 127. The gate 127 is opened and airtightly closed by a gate valve 128. The gates 125 and 127 have a size that allows the leading end of the first transfer mechanism 21 holding the substrate and the leading end of the second transfer mechanism 41 holding the substrate to pass therethrough, respectively.

As described above, each of the load-lock modules 30 (30A and 30B) includes at least two chambers (first chamber 110 and second chamber 120). Further, the first chamber 110 and the second chamber 120 are independent and separate components.

The cooling passage 130 is disposed between the first chamber 110 and the second chamber 120. The cooling passage 130 may have an upper surface defined by a bottom surface of the first chamber 110 and a bottom surface defined by an upper surface of the second chamber 120. In the example of FIG. 1, the outline of the cooling passage 130 is indicated by a dotted line. In FIG. 1, the cooling passage 130 extends along the long side of the atmospheric transfer chamber 20, i.e., along the X-axis direction. Further, the cooling passage 130 is connected to a supply device (SD) 131 (see FIG. 1) for supplying a coolant. The supply device 131 supplies a coolant having a predetermined temperature to the cooling passage 130. The coolant flowing through the cooling passage 130 absorbs heat generated by the substrate processing in the first chamber 110 and returns to the supply device 131. The supply device 131 adjusts the temperature of the coolant circulated through the cooling passage 130 to a predetermined temperature and returns the temperature-adjusted coolant to the cooling passage 130. A plurality of cooling passages 130 may be disposed in parallel between the first chamber 110 and the second chamber 120. Alternatively, one cooling passage 130 may be disposed to reciprocate multiple times between the first chamber 110 and the second chamber 120. The coolant flowing through the cooling passage 130 may be a gas or a liquid cooled to a predetermined temperature. Further, the supply device 131 may be a device including a pump, a valve, or the like, for circulating a cold liquid, or may be a device such as a fan that generates airflow.

Referring back to FIG. 1, the substrate processing system 1 will be further described.

The vacuum transfer chamber 40 is maintained in a vacuum atmosphere. The vacuum transfer chamber 40 has therein a space for transferring the substrate. The vacuum transfer chamber 40 shown in FIG. 1 has a substantially pentagonal shape in a plan view. The load-lock modules 30A and 30B are arranged along two sides of the pentagonal shape, respectively. The processing modules 50 are arranged along other two sides of the pentagonal shape. However, the arrangement positions of the load-lock module 30 and the processing module 50 are not limited to the illustrated positions.

The second transfer mechanism 41 for transferring the substrate is disposed in the vacuum transfer chamber 40. Similarly to the first transfer mechanism 21, the second transfer mechanism 41 is, e.g., a transfer robot having an arm capable of moving in three axial directions. The second transfer mechanism 41 transfers the substrate between the load-lock module 30 and the processing module 50.

The processing module 50 is a substrate processing chamber for performing substrate processing. The processing module 50 may employ a configuration disclosed in Japanese Patent No. 6141855.

The controller 60 is, e.g., a computer, and includes a storage unit 60a and a control unit 60b.

The storage unit 60a is realized by, e.g., a semiconductor memory device such as a random access memory (RAM), a flash memory, or the like, or a storage device such as a hard disk, an optical disk, or the like. The storage unit 60a is configured to store programs for controlling various processes performed in the substrate processing system 1.

The control unit 60b includes a microcomputer having a central processing unit (CPU), a read only memory (ROM), a random access memory (RAM), and an input/output port, and various circuits. The control unit 60b is configured to control the operation of the substrate processing system 1 by reading and executing the programs stored in the storage unit 60a.

The programs may be stored in a computer-readable storage medium and installed in the storage unit 60a of the controller 60 from the storage medium. The computer-readable storage medium includes, e.g., a hard disk (HD), a flexible disk (FD), a compact disk (CD), a magnetic optical disk (MO), a memory card, or the like.

Example of a Sequence of the Substrate Processing

Figure 3:
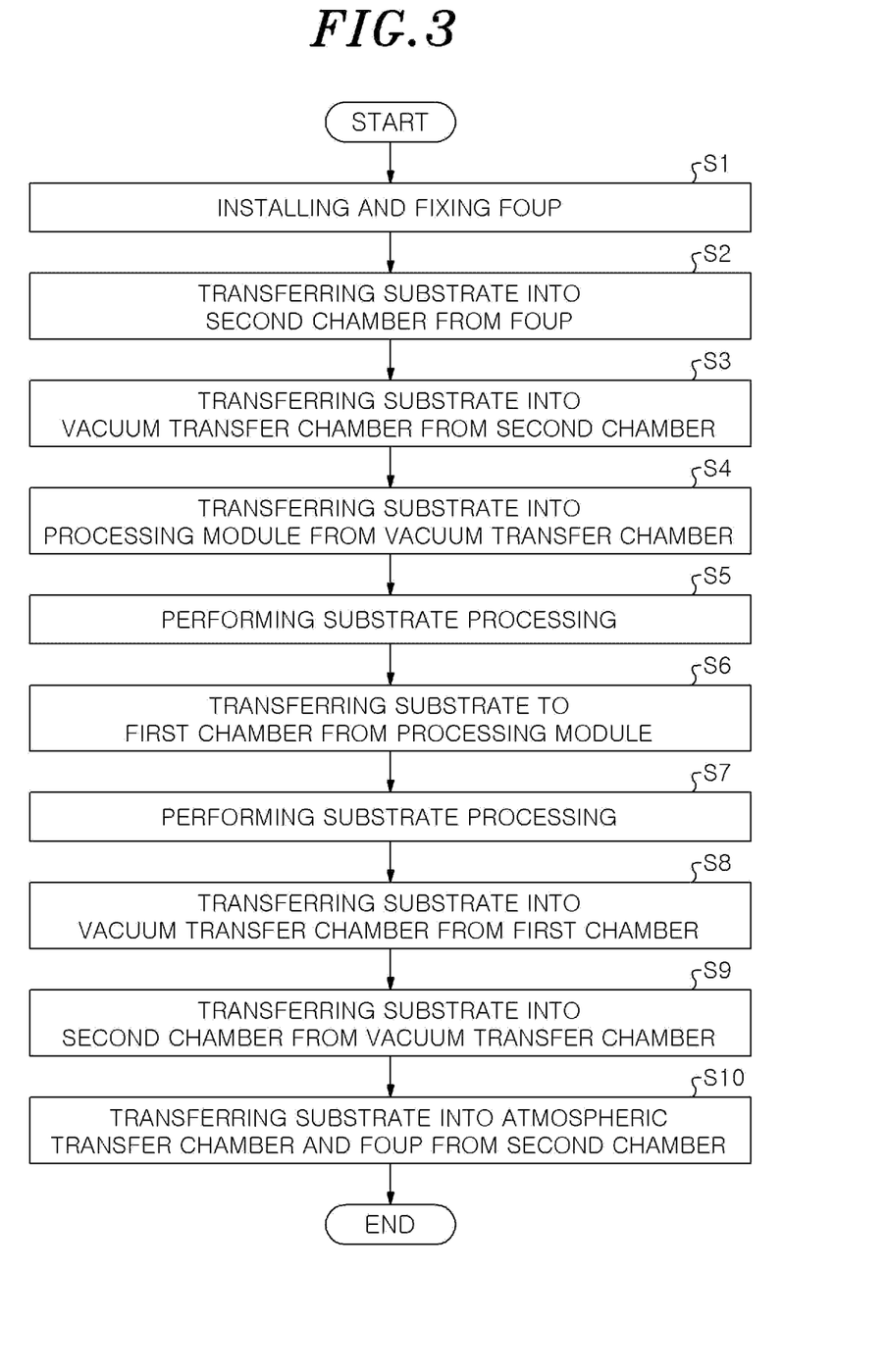
FIG. 3 is a flowchart showing an example of a sequence of substrate processing performed by the substrate processing system according to the embodiment.

Next, an example of a sequence of the substrate processing performed by the substrate processing system 1 according to the embodiment will be described with reference to FIG. 3. FIG. 3 is a flowchart showing the example of the sequence of the substrate processing performed by the substrate processing system according to the embodiment.

First, the FOUP is installed and fixed onto the load port 10 (step S1). The first transfer mechanism 21 holds the substrate in the FOUP and transfers the substrate into the second chamber 120 through the gate 125 opened by the gate valve 126 (step S2). The first transfer mechanism 21 places the substrate on the substrate support 121 in the second chamber 120. After the substrate is placed, the gate valve 126 is closed and the second chamber 120 is evacuated and maintained in a vacuum atmosphere. Next, the gate 127 is opened by the gate valve 128. Then, the second transfer mechanism 41 in the vacuum transfer chamber 40 enters the second chamber 120 to hold the substrate on the substrate support 121 and transfer the substrate into the vacuum transfer chamber 40 (step S3). The second transfer mechanism 41 transfers the substrate into a designated processing module 50 under the control of the controller 60 (step S4). The number of processes performed on one substrate is not particularly limited, and the number of the processing modules 50 where the substrate is transferred to be processed is not also particularly limited. The loading of the substrate to the processing module 50 and the unloading of the substrate from the processing module 50 by the second transfer mechanism 41 are repeated based on the recipe preset in the controller 60, thereby processing the substrate (step S5).

Upon the completion of the processing of the substrate in the processing module 50, the second transfer mechanism 41 transfers the substrate to the first chamber 110 (step S6). First, the gate 117 is opened by the gate valve 118. The second transfer mechanism 41 transfers the substrate into the first chamber 110 through the gate 117 and places the substrate on the substrate support 111. When the substrate is loaded into the first chamber 110, the gate valve 118 is closed. In the first chamber 110, the substrate processing is performed under the control of the controller 60 (step S7). The substrate processing executed in the first chamber 110 is, e.g., post-treatment. For example, the post-treatment is ashing. When the processing in the first chamber 110 is completed, the gate 117 is opened by the gate valve 118. The second transfer mechanism holds the substrate on the substrate support 111 and transfers the substrate to the vacuum transfer chamber 40 (step S8). Next, the second transfer mechanism 41 transfers the substrate into the second chamber 120 (step S9). First, the gate 127 is opened by the gate valve 128. At this time, the gate valve 126 is in a closed state. Then, the second transfer mechanism 41 places the substrate on the substrate support 121 in the second chamber 120 and retracts to the vacuum transfer chamber 40. After the second transfer mechanism 41 retracts, the gate valve 128 is closed. In the second chamber 120, the cooling mechanism 122 cools the substrate support 121 under the control of the controller 60, thereby lowering the temperature of the substrate to be within a predetermined temperature range (step S9). Next, the gate 125 is opened by the gate valve 126. Then, the first transfer mechanism 21 enters the second chamber 120 through the gate 125. The first transfer mechanism 21 holds the substrate placed on the substrate support 121 and transfers the substrate to the atmospheric transfer chamber 20. The first transfer mechanism 21 transfers the substrate to a designated FOUP under the control of the controller 60 (step S10). In this manner, the substrate processing in the substrate processing system 1 is completed.

In the substrate processing performed by the substrate processing system 1, the coolant is supplied to the cooling passage 130 while the substrate processing is being performed in the first chamber 110. Further, the coolant may be continuously supplied to the cooling passage 130 for a predetermined time period after the substrate processing is performed in the first chamber 110. The time period of the coolant supply is set in consideration of the increase in temperature by the substrate processing in the first chamber 110, the temperature of the coolant, and the like.

It is preferred that the footprints of the first chamber 110 and the second chamber 120 are substantially the same. With this configuration, the two chambers can be vertically stacked to be overlapped with each other when viewed from the top without requiring a large design change from the conventional load-lock module, and the increase in the footprint of the substrate processing system 1 can be suppressed. In the present embodiment, the two chambers are vertically stacked to be overlapped with each other when viewed from the top in the load-lock module. However, three or more chambers may be vertically stacked to be overlapped with one another. In this case, a cooling passage is disposed between adjacent chambers. Further, one common coolant supply device may be provided for a plurality of cooling passages, or a plurality of coolant supply devices may be provided to correspond to the cooling passages.

The distance between the substrate supporting surface of the substrate support 111 in the first chamber 110 and the substrate supporting surface of the substrate support 121 in the second chamber 120 is not particularly limited. However, the distance therebetween is preferably 250 mm in order to suppress an increase in the height of the load-lock module 30.

In the above embodiment, the first chamber 110 has been described as a plasma processing apparatus that generates inductively coupled plasma (ICP). The present disclosure is not limited thereto, and any plasma source such as capacitively coupled plasma (CCP), microwave plasma or the like can be used as a plasma source of the first chamber 110.

In the example of FIG. 3, the substrate processing in the first chamber 110 is performed after the substrate processing in the processing module 50. However, the present disclosure is not limited thereto, and the substrate processing in the first chamber 110 may be performed before the substrate processing in the processing module 50. Further, the substrate may be directly transferred to the second chamber 120 and then transferred to the atmospheric transfer chamber 20 after the substrate processing in the processing module 50.

Effects of the Embodiment

As described above, the substrate processing system according to the embodiment includes the first chamber, the second chamber, and the cooling passage. The first chamber has therein the space for processing the substrate transferred from the first transfer chamber maintained in a vacuum atmosphere. The inner space of the second chamber can communicate with the inner space of the first transfer chamber and the inner space of the second transfer chamber maintained in the atmospheric atmosphere. The second chamber has a footprint that is substantially the same as that of the first chamber. The second chamber is disposed below the first chamber to be vertically aligned with the first chamber. For example, when viewed from the top, i.e., when viewed from the positive direction toward the negative direction of the Z-axis in FIG. 1, the second chamber is disposed such that the upper surface of the second chamber and the bottom surface of the first chamber are substantially overlapped with each other. The cooling passage is disposed between the first chamber and the second chamber, and the coolant flows therethrough. As described above, in the substrate processing system according to the embodiment, the footprint of the first chamber and the footprint of the second chamber are substantially the same, and the first chamber and the second chamber are vertically arranged to be overlapped with each other. Therefore, in accordance with the embodiment, the increase in the footprint of the substrate processing system can be suppressed. Further, the increase in the number of the processing modules can be suppressed due to the presence of the first chamber of the load-lock module that provides the space for performing the substrate processing. Moreover, the space in the substrate processing system can be effectively utilized.

Further, in the substrate processing system according to the embodiment, a part of the inner wall of the cooling passage is defined by at least a part of the bottom surface of the first chamber and at least a part of the upper surface of the second chamber. Therefore, the increase in the number of components of the substrate processing system can be suppressed.

Further, the substrate processing system according to the embodiment further includes the supply device configured to supply a coolant to the cooling passage. The cooling passage and the supply device are disposed outside the first transfer chamber, the second transfer chamber, the first chamber and the second chamber. Therefore, it is unnecessary to adjust a substrate transfer path to arrange the mechanism for suppressing heat exchange between the first chamber and the second chamber disposed in the load-lock module, and the substrate can be efficiently transferred.

Further, in the substrate processing system according to the embodiment, the first chamber accommodates a substrate processing apparatus configured to perform any one of ashing, etching, and film formation. Therefore, the substrate processing system according to the embodiment can realize the substrate processing by flexibly combining the processing performed in the processing module and the processing performed in the first chamber based on the sequence of the substrate processing.

Further, in the substrate processing system according to the embodiment, the second chamber includes the cooling mechanism for cooling the substrate. Therefore, the substrate processing system according to the embodiment can adjust the temperature of the processed substrate and transfer the temperature-adjusted substrate to the atmospheric transfer chamber.

In addition, in the substrate processing system according to the embodiment, the first chamber may include the heating mechanism configured to heat the substrate and the cooling mechanism, provided separately from the cooling passage, configured to cool the member of the first chamber heated by the substrate processing. Therefore, even if the temperature of the processing space and the temperatures of the surrounding members are increased by the substrate processing performed in the first chamber, the heat exchange with the second chamber can be suppressed.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate processing system comprising:
a first chamber having therein a space for processing a substrate transferred from a first transfer chamber maintained in a vacuum atmosphere;
a second chamber disposed below the first chamber to be vertically aligned with the first chamber and configured to communicate with the first transfer chamber and a second transfer chamber maintained in an atmospheric atmosphere, wherein the second chamber has substantially the same footprint as a footprint of the first chamber; and
a cooling passage disposed between the first chamber and the second chamber and configured to allow a coolant to flow therethrough,
wherein a part of an inner wall of the cooling passage is defined by at least a part of a bottom surface of the first chamber and at least a part of an upper surface of the second chamber.

2. The substrate processing system of claim 1, further comprising:
a supply unit configured to supply the coolant to the cooling passage,
wherein the cooling passage and the supply unit are disposed outside the first transfer chamber, the second transfer chamber, the first chamber, and the second chamber.

3. A substrate processing system comprising:
a first chamber having therein a space for processing a substrate transferred from a first transfer chamber maintained in a vacuum atmosphere;
a second chamber disposed below the first chamber to be vertically aligned with the first chamber and configured to communicate with the first transfer chamber and a second transfer chamber maintained in an atmospheric atmosphere, wherein the second chamber has substantially the same footprint as a footprint of the first chamber; and
a cooling passage disposed between the first chamber and the second chamber and configured to allow a coolant to flow therethrough,
wherein the first chamber accommodates a substrate processing apparatus configured to perform any one of ashing, etching, and film formation.

4. The substrate processing system of claim 1, wherein the first chamber accommodates a substrate processing apparatus configured to perform any one of ashing, etching, and film formation.

5. The substrate processing system of claim 2, wherein the first chamber accommodates a substrate processing apparatus configured to perform any one of ashing, etching, and film formation.

6. The substrate processing system of claim 1, wherein the second chamber includes a cooling mechanism configured to cool the substrate.

7. The substrate processing system of claim 2, wherein the second chamber includes a cooling mechanism configured to cool the substrate.

8. The substrate processing system of claim 3, wherein the second chamber includes a cooling mechanism configured to cool the substrate.

9. The substrate processing system of claim 1, wherein the first chamber includes a heating mechanism configured to heat the substrate and a cooling mechanism configured to cool a member of the first chamber heated by substrate processing, the cooling mechanism being separately provided from the cooling passage.

10. The substrate processing system of claim 2, wherein the first chamber includes a heating mechanism configured to heat the substrate and a cooling mechanism configured to cool a member of the first chamber heated by substrate processing, the cooling mechanism being separately provided from the cooling passage.

11. The substrate processing system of claim 3, wherein the first chamber includes a heating mechanism configured to heat the substrate and a cooling mechanism configured to cool a member of the first chamber heated by substrate processing, the cooling mechanism being separately provided from the cooling passage.

12. A substrate processing system comprising:
a first chamber having therein a space for processing a substrate transferred from a first transfer chamber maintained in a vacuum atmosphere;
a second chamber disposed below the first chamber to be vertically aligned with the first chamber and configured to communicate with the first transfer chamber and a second transfer chamber maintained in an atmospheric atmosphere, wherein the second chamber has substantially the same footprint as a footprint of the first chamber; and a cooling passage disposed between the first chamber and the second chamber and configured to allow a coolant to flow therethrough, wherein the second chamber includes a cooling mechanism configured to cool the substrate, and wherein the first chamber includes a heating mechanism configured to heat the substrate and a cooling mechanism configured to cool a member of the first chamber heated by substrate processing, the cooling mechanism being separately provided from the cooling passage.

* * * * *